(12) United States Patent
Wang

(10) Patent No.: US 9,543,958 B1
(45) Date of Patent: Jan. 10, 2017

(54) MULTIPLEXER-MEMORY CELL CIRCUIT, LAYOUT THEREOF AND METHOD OF MANUFACTURING SAME

(71) Applicant: Flex Logix Technologies, Inc., Mountain View, CA (US)

(72) Inventor: Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 15/015,057

(22) Filed: Feb. 3, 2016

Related U.S. Application Data

(60) Provisional application No. 62/117,473, filed on Feb. 18, 2015.

(51) Int. Cl.
  *H03K 19/173* (2006.01)
  *H03K 19/177* (2006.01)

(52) U.S. Cl.
  CPC .... *H03K 19/17772* (2013.01); *H03K 19/1776* (2013.01); *H03K 19/17724* (2013.01); *H03K 19/17744* (2013.01)

(58) Field of Classification Search
  CPC ............ H03K 19/177; H03K 19/17704; H03K 19/17724; H03K 19/17748; H03K 19/1776
  USPC ................................ 326/37–41, 47, 112–113
  See application file for complete search history.

(56) References Cited

U.S. PATENT DOCUMENTS

| | | | | |
|---|---|---|---|---|
| 5,491,353 A * | 2/1996 | Kean | .................. | H03K 19/1736 257/204 |
| 6,765,295 B1 * | 7/2004 | Gedamu | .............. | H03K 17/693 257/211 |
| 7,477,073 B1 * | 1/2009 | Tuan | ................ | H03K 19/17736 326/101 |
| 8,058,137 B1 * | 11/2011 | Or-Bach | .............. | H03K 17/687 257/E21.023 |
| 2008/0231314 A1 * | 9/2008 | Teig | .................. | H03K 19/17704 326/37 |
| 2011/0267103 A1 * | 11/2011 | Gitlin | ................. | H03K 19/0008 326/41 |
| 2012/0307545 A1 * | 12/2012 | McAdams | ............ | G11C 11/221 365/145 |

* cited by examiner

*Primary Examiner* — Jason M Crawford
(74) *Attorney, Agent, or Firm* — Neil A. Steinberg

(57) ABSTRACT

An integrated circuit includes a plurality of logic tiles, wherein each logic tile includes a plurality of edges and, is configurable to communicate, during operation, with at least one adjacent logic tile, and wherein a first logic tile includes: (i) a plurality of static memory cells to store data, wherein each memory cell includes a first output, (ii) a multiplexer including inputs, an output and input selects, (iii) a plurality of poly-silicon conductors, each poly-silicon conductor is disposed in the substrate and connected to the first output of an associated memory cell, (iv) poly-silicon extensions, each poly-silicon extension is (a) connected to an associated poly-silicon conductor and (b) coupled to an associated input select of the multiplexer, wherein the poly-silicon extensions are disposed in the substrate and at least partially under a metal conductor in the first logic tile.

20 Claims, 12 Drawing Sheets

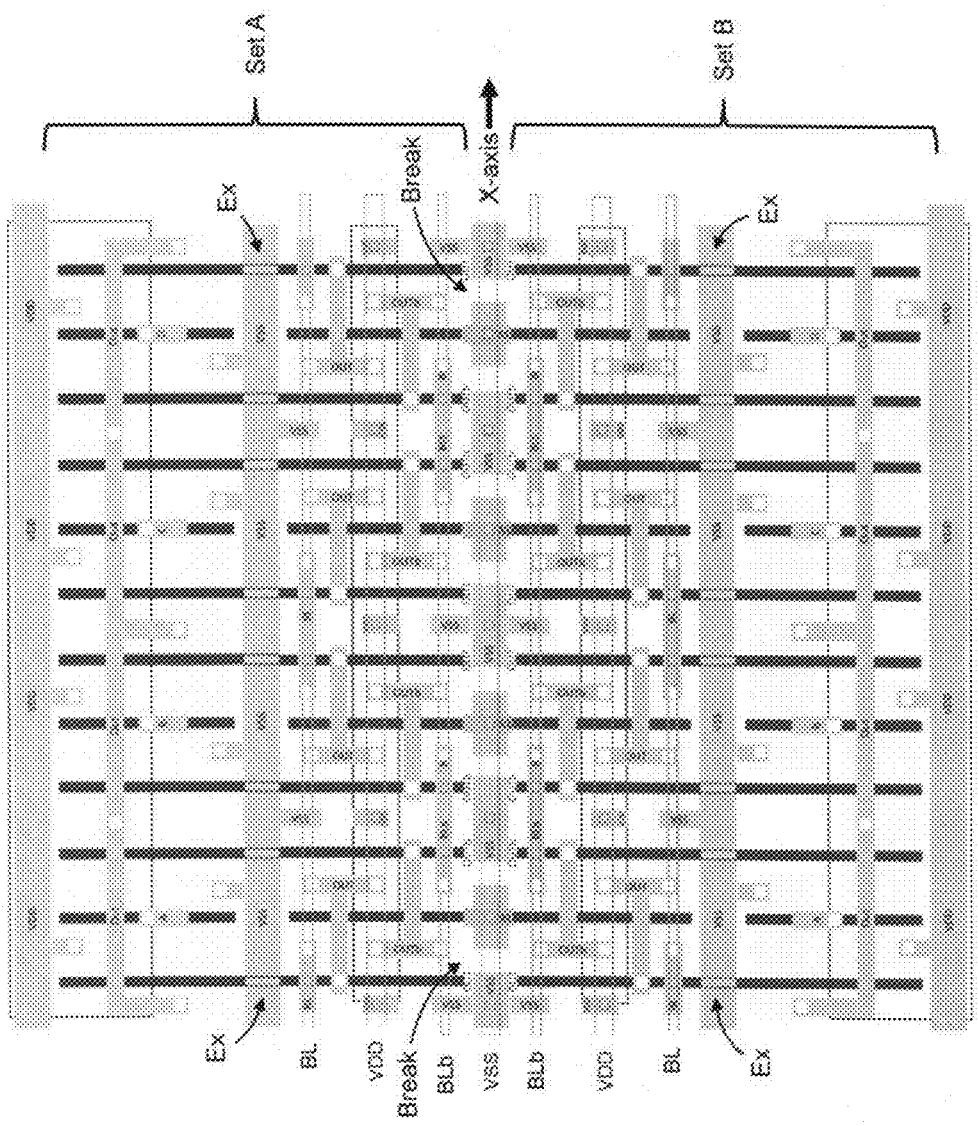

MULTIPLEXER-MEMORY CELL CIRCUIT, LAYOUT THEREOF AND METHOD OF MANUFACTURING SAME

RELATED APPLICATION

This non-provisional application claims priority to U.S. Provisional Application No. 62/117,473, entitled "Multiplexer-Memory Cell Circuit, Layout Thereof and Method of Manufacturing Same", filed Feb. 18, 2015, which is incorporated herein by reference in its entirety.

INTRODUCTION

In one aspect, the present inventions are directed to an integrated circuit, and layout thereof, including a multiplexer-memory cell circuit wherein input-selection of the multiplexer is determined by the data state stored in the one or more memory cells and the output of the memory cells are routed to the input-selection of the multiplexer on/in a common layer of the integrated circuit (for example, routed only in or via the poly-silicon layer). In one embodiment, the multiplexer-memory cell circuit is a static type configuration wherein the data states of the memory cells, and therefore the control signals applied to the multiplexer, are generally static whereby each memory cell is programmed with a data state (for example, at power-up or during an initialization sequence) and typically not re-programmed after programming and/or during operation. As such, the control signals applied to input-selection of the multiplexer are typically or largely static during operation of, for example, the integrated circuit.

The integrated circuit multiplexer-memory cell circuit, and layout thereof, may be implemented in, for example, processors, controllers, state machines, gate arrays, programmable gate arrays (PGAs), field programmable gate arrays (FPGAs), and system-on-chips (SOCs). In one embodiment of the present inventions, the multiplexer-memory cell circuit may be employed in one or more programmable or configurable logic blocks or tiles of FPGAs, processors, controllers, state machines, gate arrays, PGAs and SOCs.

Briefly, an FPGA is an integrated circuit which may be configured and/or reconfigured (hereinafter, unless stated otherwise, collectively "configured" or the like (e.g., "configure", "configuring" and "configurable")) by a user, customer and/or a designer before and/or after manufacture. The FPGA includes, among other things, a plurality of tiles having programmable logic components (often called "configurable logic blocks" (CLB), "logic array blocks" (LAB), or "logic tiles"—hereinafter collectively "logic tiles") and a network of configurable interconnects that facilitate communication (i.e., receive and/or transmit signals (e.g., clock, data and/or control signals)) to, from and/or between the logic tiles. (See, for example, FIGS. 1A and 1B).

Each logic tile typically includes thousands of transistors which may be configured to perform combinational and/or sequential functions (simple and/or complex). Such transistors are often interconnected to form a plurality of multiplexers have two or more inputs. The selection inputs of the multiplexers may be electrically connected to memory cells which, when programmed, determine which input of the multiplexer is connected to the multiplexer output. The memory cells may be static or dynamic. For example, in the context of static memory cells, the selection inputs may be electrically coupled to one or more flip-flops, latches and/or more complete blocks/arrays of memory (for example, an SRAM array) that may be programmed after IC manufacture.

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIG. 7 illustrates an exemplary layout of two sets (Set A and Set B) of static multiplexer-memory cell circuits according to certain aspects of the present inventions; notably, the two rows of memory cells are mirrored along the X-axis and share WL signal and reduce the number of vias in the routing using the inventive layout configuration of FIG. 6 and the output signals OUT and OUTb of the memory cells are routed to the associated transistors of the multiplexer via the poly-silicon layer by extending the poly-silicon routing underneath the VSS rail/conductor using the inventive layout configuration of FIG. 5A; notably, in the interest of clarity, for each of Set A and Set B, an "EX" identification of routing of OUT and OUTb conductor paths of the memory cells to associated transistors of the multiplexers is indicated at the edges of the layout for each of the eight poly-silicon extensions beneath or underneath the VSS rail/conductor; similarly "Break" identification is indicated at the edges of the layout for each of the spaces in/on metal layer along the VSS rail/conductor extending along the X-axis.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In one aspect, the present inventions relate to a multiplexer-memory cell circuit, and layout thereof, wherein the data state stored in the memory cells determine the active input of the input-selection of the multiplexer. The memory cells may be dynamic or static type cells wherein the one or more outputs of each memory cell are routed to the input-selection of the multiplexer on/in a single or common layer, for example, routed only in or via the poly-silicon layer, of the integrated circuit (for example, a processor, controller, state machine, gate array, PGA, FPGA, and SOC). In one embodiment, the multiplexer-memory cell circuit is a static type configuration of a certain data state during normal operation, and therefore the control signals applied to the multiplexer, are generally static whereby once the memory cells are programmed with a data state (for example, at power-up or during an initialization sequence) the memory cells are typically not re-programmed during operation. Here, the control signals applied to input-selection of the multiplexer are generally or largely static during operation of, for example, the integrated circuit.

In one embodiment, the multiplexer-memory cell circuit is an N-input multiplexer, N-memory cell configuration (where N≥2) wherein each selection or control input is connected to an associated memory cell. (See, for example, FIG. 2A). The memory cells may be dynamic or static type cells and, as illustrated, in one embodiment, the memory cells are static type six-transistor SRAM cells (see Inset A of FIG. 2A). Notably, however, static memory cell may be a latch, flip/flop (e.g., a JK-type flip/flop) or any other memory cell or memory cell circuit now known or later developed.

Figure 1A:
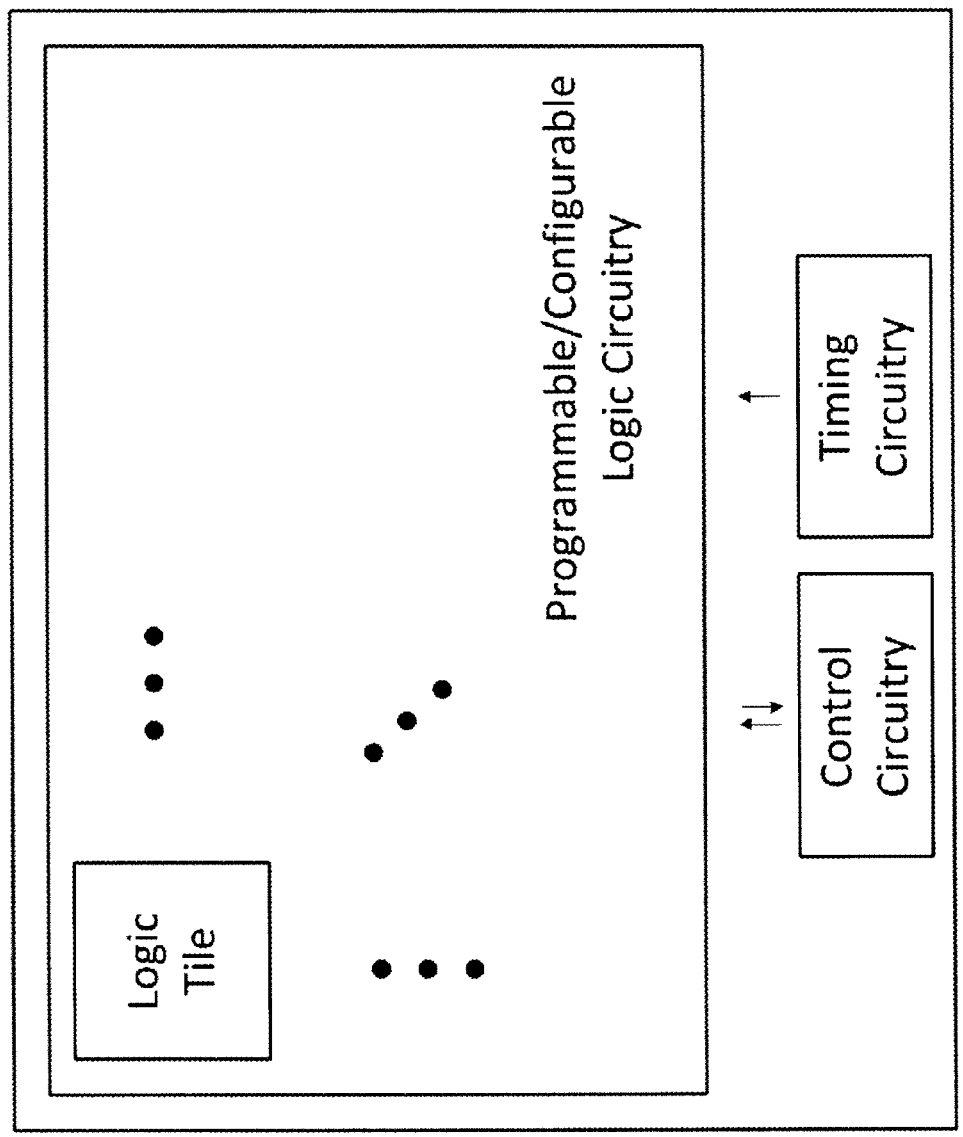
FIG. 1A illustrates a block diagram representation of, for example, an integrated circuit including control circuitry, clock circuitry and programmable/configurable logic circuitry (which may include one or more logic tiles, each of which includes logic transistors (that may be interconnected, for example, as multiplexers having two or more inputs which are electrically coupled to associated memory cells that, when programmed, determine the operation of the multiplexers))
Figure 1B:
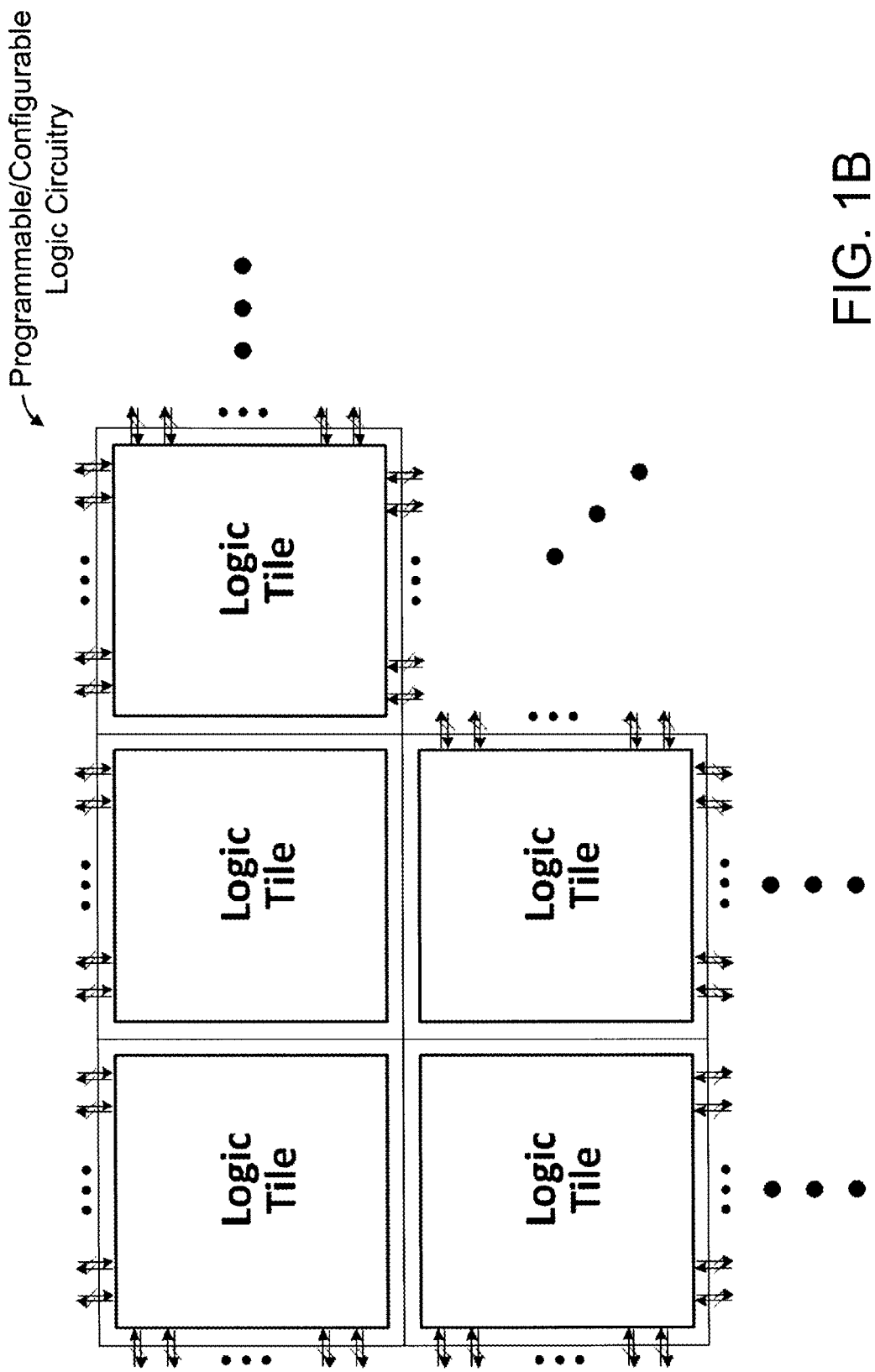
FIG. 1B illustrates a block diagram representation of a plurality of interconnected logic tiles of programmable/configurable logic circuitry, for example, an FPGA, wherein input/output of the logic tiles may facilitate communication between logic tiles and/or circuitry external to the programmable/configurable logic circuitry; notably, the programmable/configurable logic circuitry may be comprised of a plurality of programmable logic tiles.
Figure 2A:
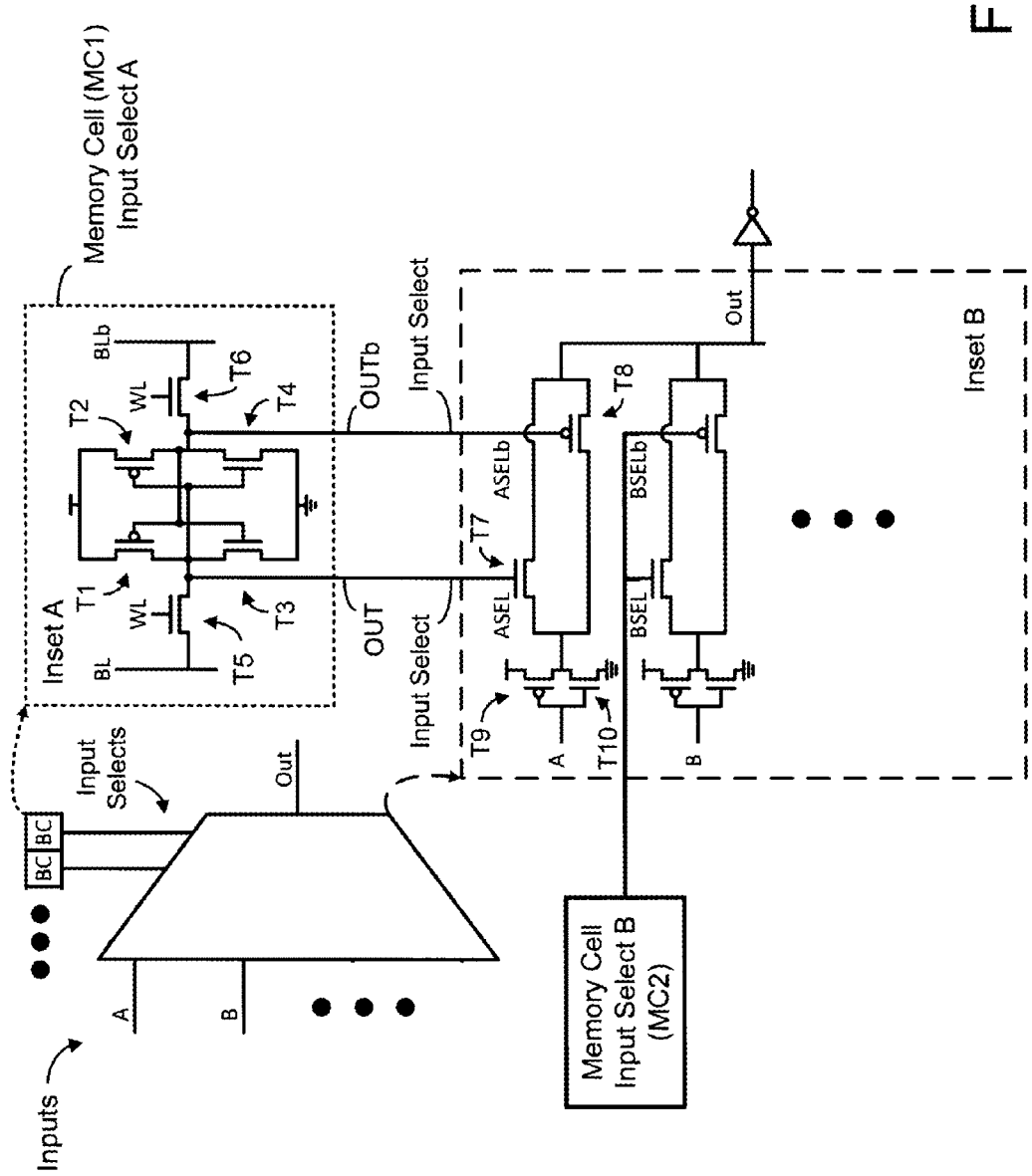
FIG. 2A illustrates an exemplary schematic block diagram representation an N-input multiplexer (where N≥2; i.e., inputs (A, B . . . ) wherein each selection or control input is connected to an associated memory cell; notably, Inset A illustrates an exemplary static memory cell (which, in this exemplary illustration, is a six-transistor SRAM cell—albeit the static memory cell may be a latch, flip/flop (e.g., a JK-type flip/flop) or any other memory cell or memory cell circuit now known or later developed), and Inset B illustrates an exemplary multiplexer circuit at a transistor and logic level; moreover, in this exemplary embodiment, the multiplexer consist of a plurality of transmission gates and, as such, include a complementary input pair to receive both the true-and-complement outputs (OUT and OUTb) of each memory cell which are routed to respective gate of the NMOS and PMOS transistors of the transmission gates of each input to output propagation path (which, in this exemplary embodiment, routes 2*N input-selection conductors from the memory cells to the associated circuitry in the multiplexer)

With continued reference to FIG. 2A, in one embodiment, the multiplexer includes a plurality of transmission gates to control the input-to-output data selection and, as such, in the illustrative embodiment, the true-and-complement outputs (OUT and OUTb) of each memory cell are routed to respective gate of the NMOS and PMOS transistors of the transmission gates of each input to output propagation path (which, in this exemplary embodiment, routes 2*N input-selection conductors from the memory cells to the associated circuitry in the multiplexer) to control or determine input-to-output data selection.

As noted above, "N" of the N-input multiplexer, N-memory cell configuration is greater than or equal to two. For example, with reference to FIG. 2B, where N equals 4, a multiplexer having four inputs (A, B, C, D) wherein each selection or control input is connected to an associated memory cell whose data state determines which input of the multiplexer is connected to the multiplexer output. The Inset A again illustrates an exemplary static memory cell (albeit the static memory cell may be a latch, flip/flop or any other memory cell or memory cell circuit now known or later developed) and Inset B again illustrates an exemplary multiplexer circuit at a transistor and logic level. Notably, the multiplexers of FIGS. 2A and 2B are a one-hot-bit design and, as such, only one input-selection is active at any given time (otherwise multiple inputs are shorted together).

Figure 2B:
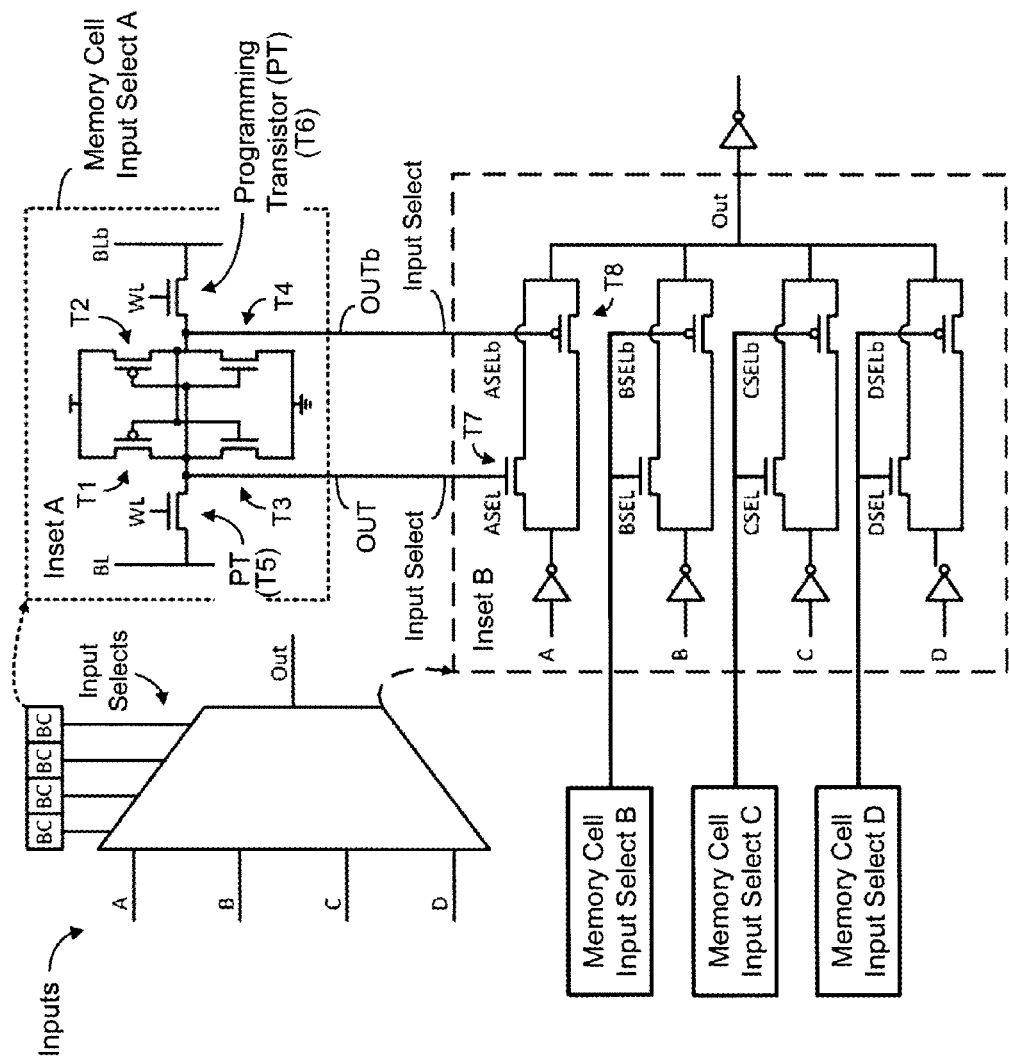
FIG. 2B illustrates an exemplary schematic block diagram representation a multiplexer having four inputs (A, B, C, D) wherein each selection or control input is connected to an associated memory cell whose data state determines which input of the multiplexer is connected to the multiplexer output; notably, Inset A again illustrates an exemplary static memory cell and Inset B again illustrates an exemplary multiplexer circuit at a transistor and logic level; moreover, the multiplexer of FIGS. 2A and 2B are a one-hot-bit design and, as such, only one input-selection is active at any given time (otherwise multiple inputs are shorted together)
Figure 3A:
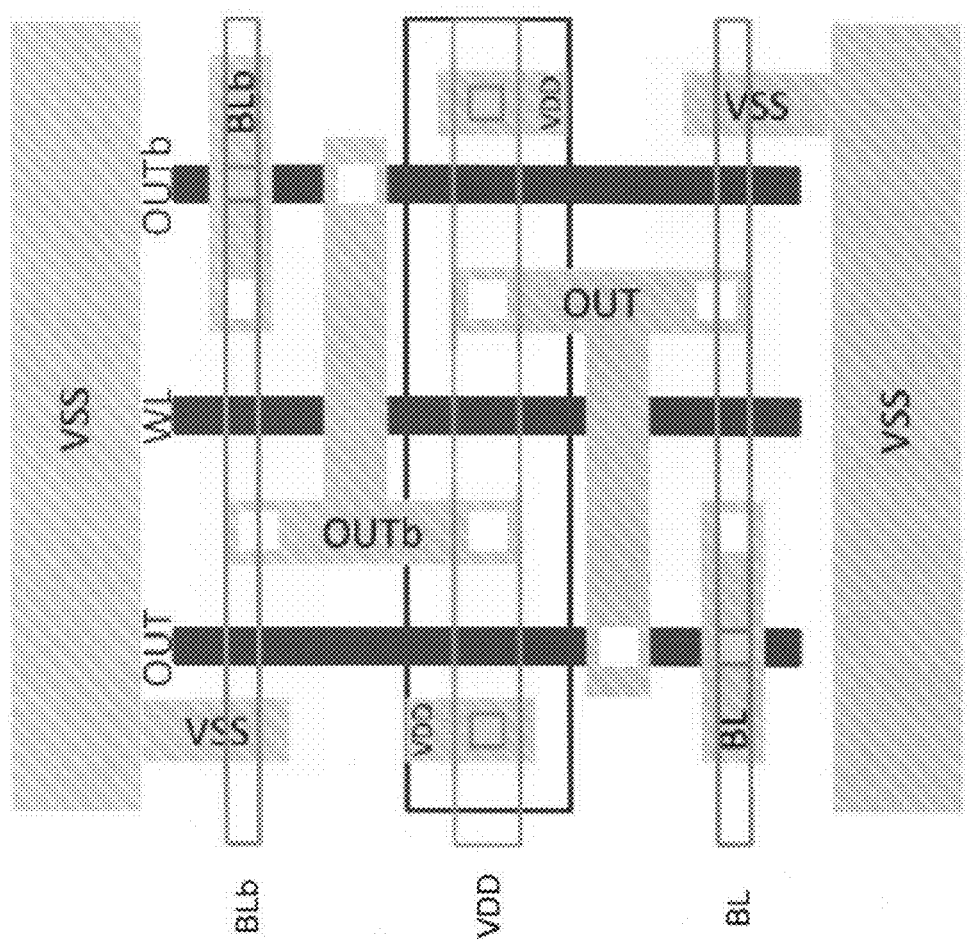
FIG. 3A illustrates a conventional layout of the exemplary memory cell of FIGS. 2A and 2B; notably, the OUT and OUTb outputs of the memory cell are accessible and routed directly to the multiplexer; in those instances where the memory cell is an SRAM cell, the layout of the memory cell may be larger than a typical or standard 6T-SRAM cell layout; in an effort to reduce the layout size of the memory cell, in the exemplary illustrated embodiment, (i) the top and bottom rails/conductors are VSS, using M1 layer, (ii) VDD rail/conductor is routed through the middle of the memory cell, using M3 metal layer (green), (iii) BL and BLb are routed horizontally on metal layer M3 and the three vertical poly-silicon drawings are OUT, WL, and OUTb; notably, in other (e.g., more advanced) technologies, using High-k Metal Gate (HKMG), the poly-silicon structure is built using metal, in spite of the fact that the gate of the transistor may still be referred to as "poly-silicon" or "poly"
Figure 3B:
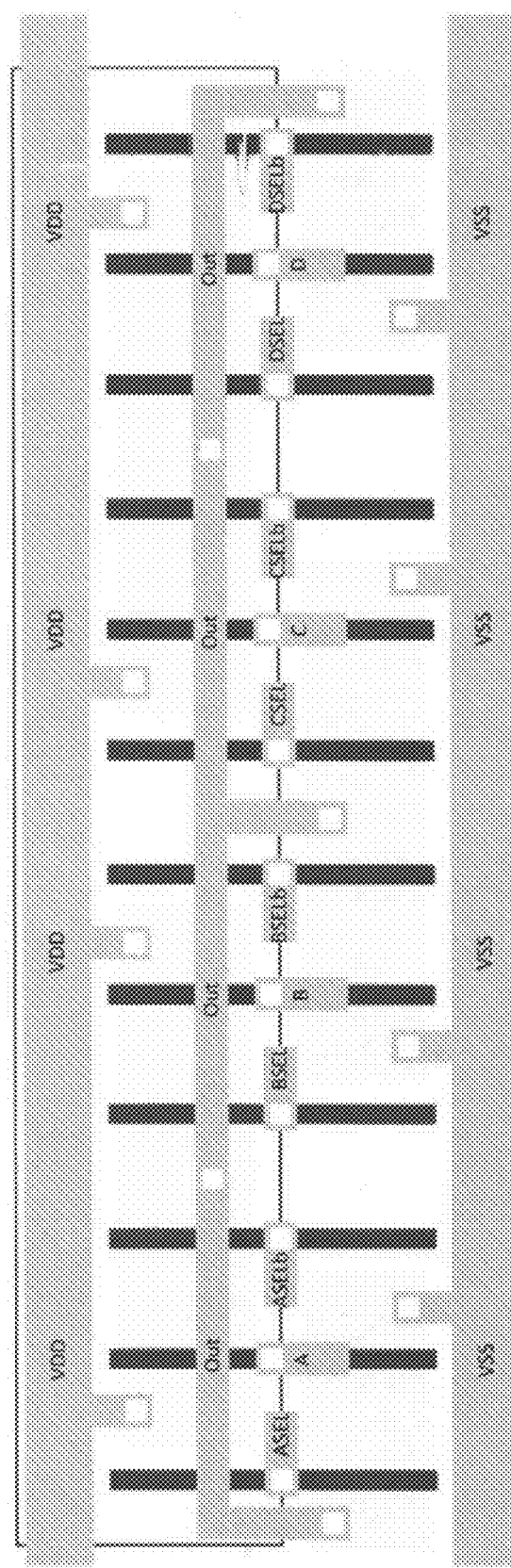
FIG. 3B illustrates a conventional layout of the exemplary static multiplexer has N-inputs (N=4 in this illustrative example—i.e., Inputs A, B, C, D) of FIG. 2B in conjunction with 2*N input select lines for true-and-complementary selection; notably, A/B/C/DSEL drives or controls the NMOS transistors of A/B/C/D inputs, respectively, and A/B/C/DSELb drives or controls the PMOS transistors, respectively; the layout size is often limited by the rigorous design-rule requirements in deep-submicron technologies which tends to cause what appears to be "wasted white space"
Figure 4:
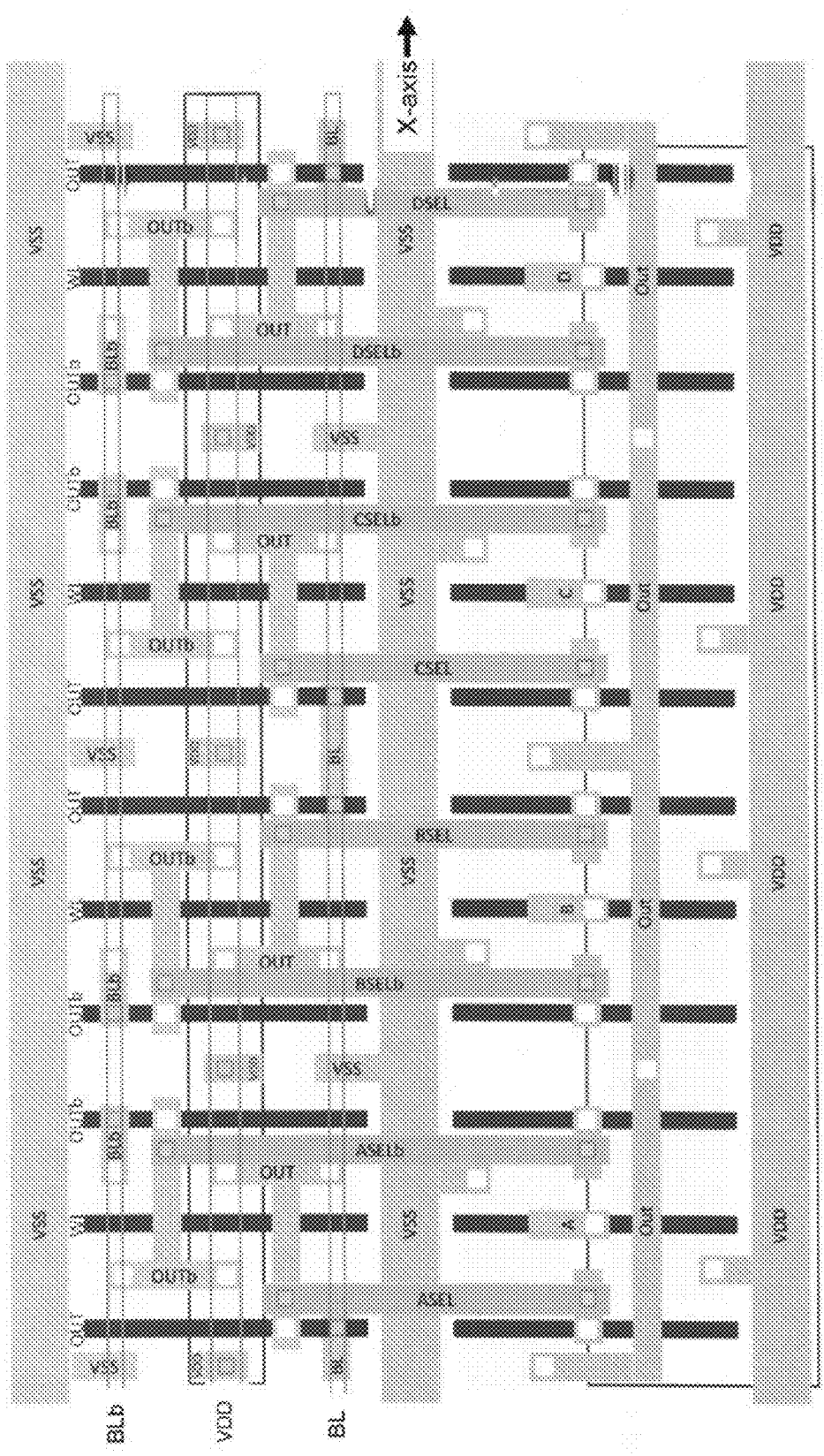
FIG. 4 illustrates an conventional layout of four memory cells integrated with a 4-input static multiplexer wherein the static multiplexer is flipped or mirrored along the X-axis to facilitate sharing the VSS rail/conductor with the memory cell layout; notably, in this exemplary layout, because the OUT and OUTb of each memory cell are routed to the SEL and SELb inputs of the multiplexer, such outputs are routed in metal layer M2 to connect to the associated transistors of the multiplexer; further, metal layer M2 is also used to route A/B/C/D inputs and Out pins down to metal layer M1.
Figure 5A:
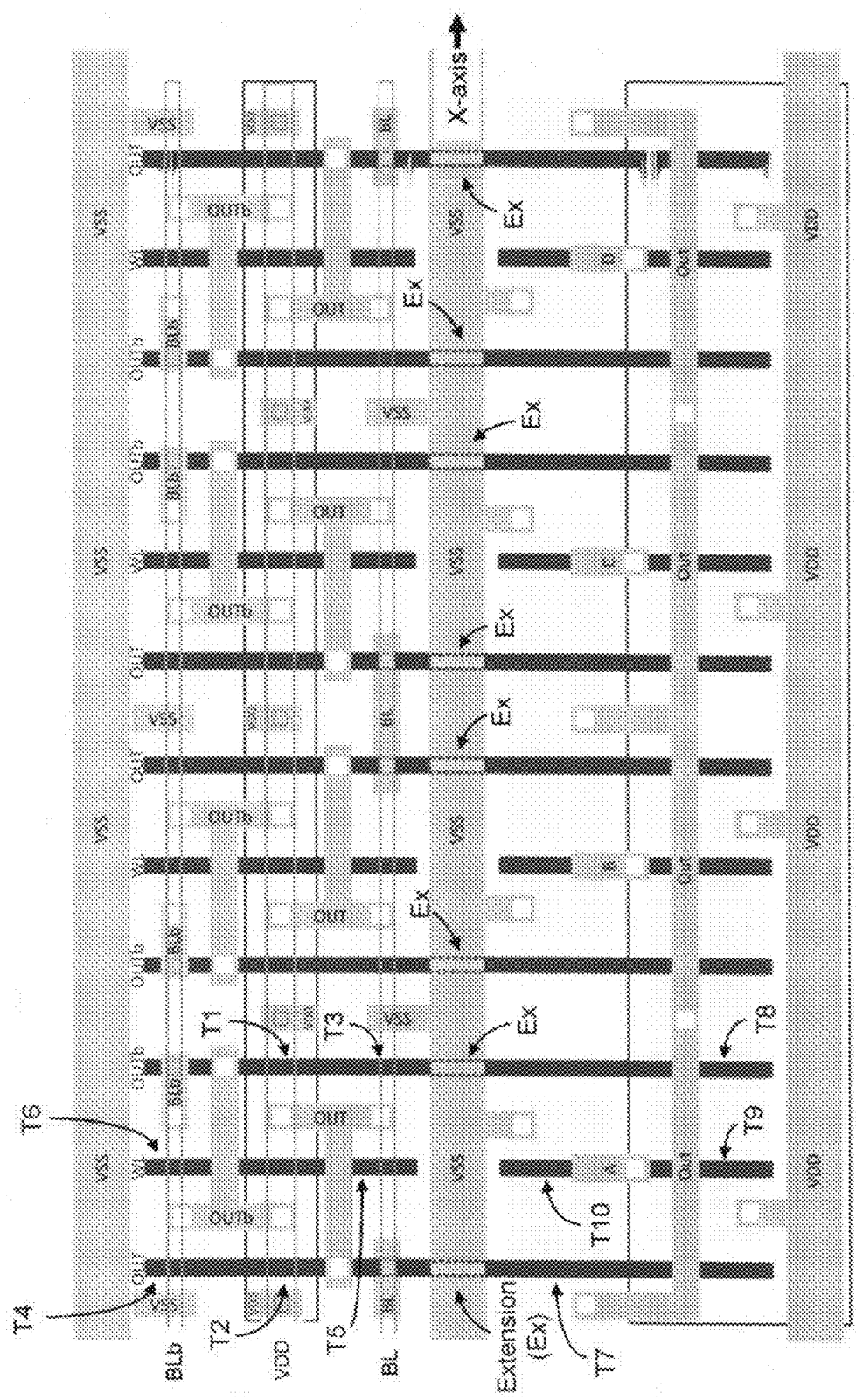
FIG. 5A illustrates an exemplary layout of a N-input multiplexer and memory cells (where N=4, for example, as schematically represented in FIG. 2B) according to certain aspects of the present inventions wherein the output signals OUT and OUTb of the memory cells are routed to the associated transistors of the multiplexer via the poly-silicon layer by extending the poly-silicon routing, beyond or in contravention of design rules, underneath the VSS rail/conductor (see "Extension (Ex)" or "Ex"), thereby routing the outputs of the memory cell to the associated transistors of the multiplexer without traversing one or more different layers (for example, one or more different metal layers—e.g., metal layer M2); in this way, the outputs of the memory cells are directly connected to the gates of the associated transistors of the multiplexer.
Figure 5B:
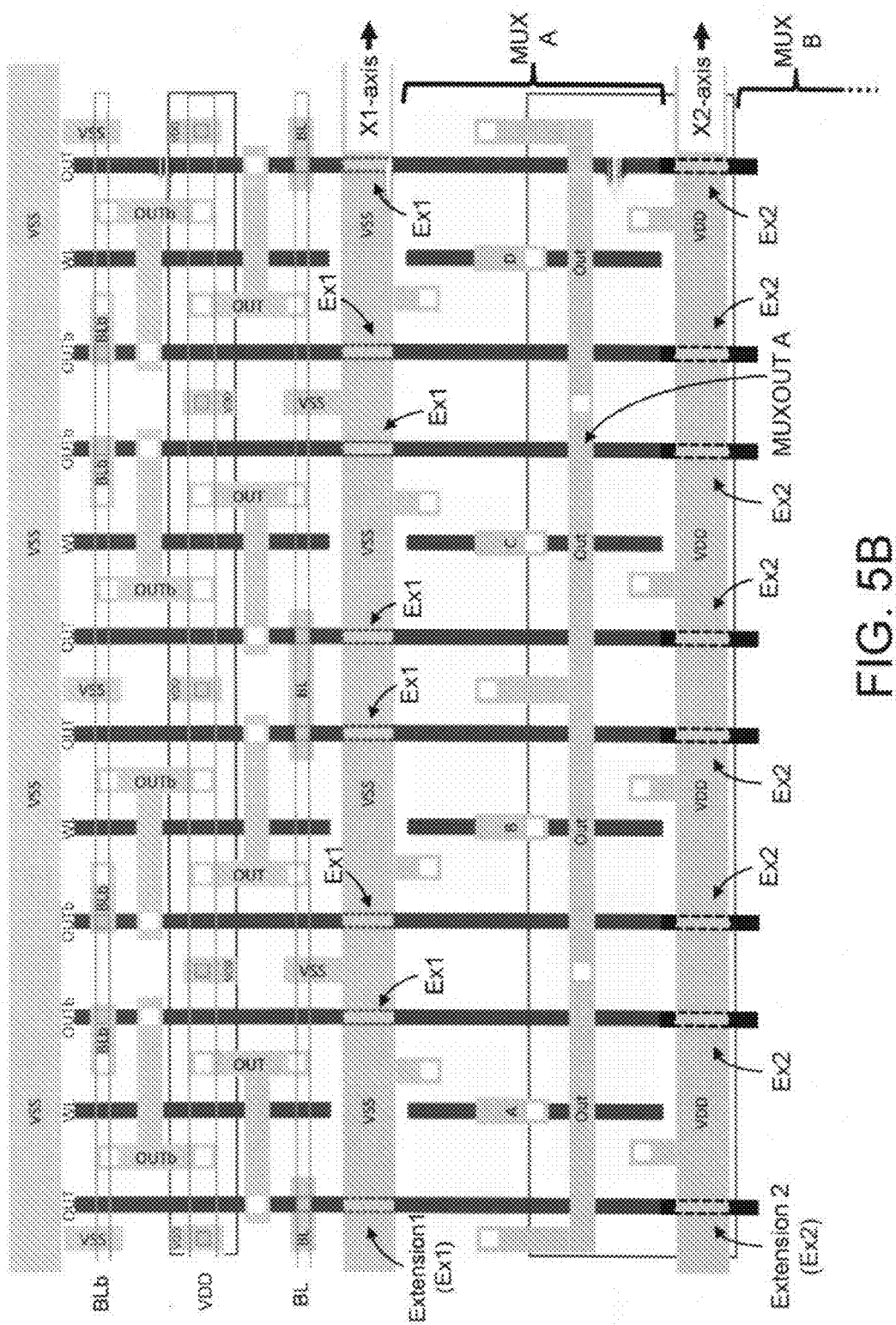
FIG. 5B illustrates an exemplary layout of two 4-input multiplexers wherein the selection or control inputs are common for each multiplexer (i.e., MUX A and MUX B), as schematically illustrated in FIG. 2C, and memory cells (where N=4) according to certain aspects of the present inventions wherein the output signals OUT and OUTb of the memory cells are routed to (i) associated transistors of the multiplexer MUX A via the poly-silicon layer by extending the poly-silicon routing, beyond common design practices, beneath or underneath the VSS rail/conductor (see "Extension 1 (Ex1)" or "Ex1") and (ii) associated transistors of the multiplexer MUX B (transistors not illustrated specifically, however, the transistor and routing layout of MUX B is a mirror image of MUX A), via the poly-silicon layer by extending the poly-silicon routing, beyond or in contravention of design rules, beneath or underneath the VDD rail/conductor (see "Extension 2 (Ex2)" or "Ex2"); in this way, the outputs of the memory cells are directly routed and/or connected to gates of the associated transistors of multiplexers MUX A and MUX B without traversing one or more different layers (for example, one or more different metal layers—e.g., metal layer M2; as intimated above, the transistor and signal routing layout of MUX B is not specifically illustrated although the layout is identical to the layout of MUX A mirrored along/about the X2-axis, this practice can be further extended (for example, to MUX C) to the extent that design rule constraints for manufacturing are not violated.

With reference to FIGS. 2B and 5A, an exemplary layout of a N-input multiplexer, N-memory cell (where N=4), according to certain aspects of the present inventions, includes conductor extensions (see "Extension (Ex)" or "Ex") to connect the outputs of the memory cells to an associated selection-input of the multiplexer via only one layer of the integrated circuit (in this embodiment, poly-silicon layer). That is, the output signals OUT and OUTb of each memory cell are routed to an associated transistor of the multiplexer via only the poly-silicon layer by extending the poly-silicon route, in contravention of design rules, underneath VSS. In this way, the output of the memory cell is routed to an associated transistors of the multiplexer without traversing one or more different layers (for example, one or more different metal layers—for example, metal layer M2). (Compare FIGS. 3A, 3B and 4 which illustrate different features/sections of conventional routing of an 4-input multiplexer, 4-memory cell configuration wherein the outputs of the memory cells are routed to associated input-selections of the multiplexer in metal layer M2 to connect to the associated transistors of the multiplexer and metal layer M2 is also used to route A/B/C/D inputs and Out to metal layer M1). Although the layout of the signal path of the control or selection signals is different from common design practices in standard-cell-based design, (i.e., outputs of the memory cells are routed to associated transistors of the static multiplexer via extending the poly-silicon route), the present inventions provide a more compact and less complicated routing and layout than routing through a plurality different layers.

Figure 2C:
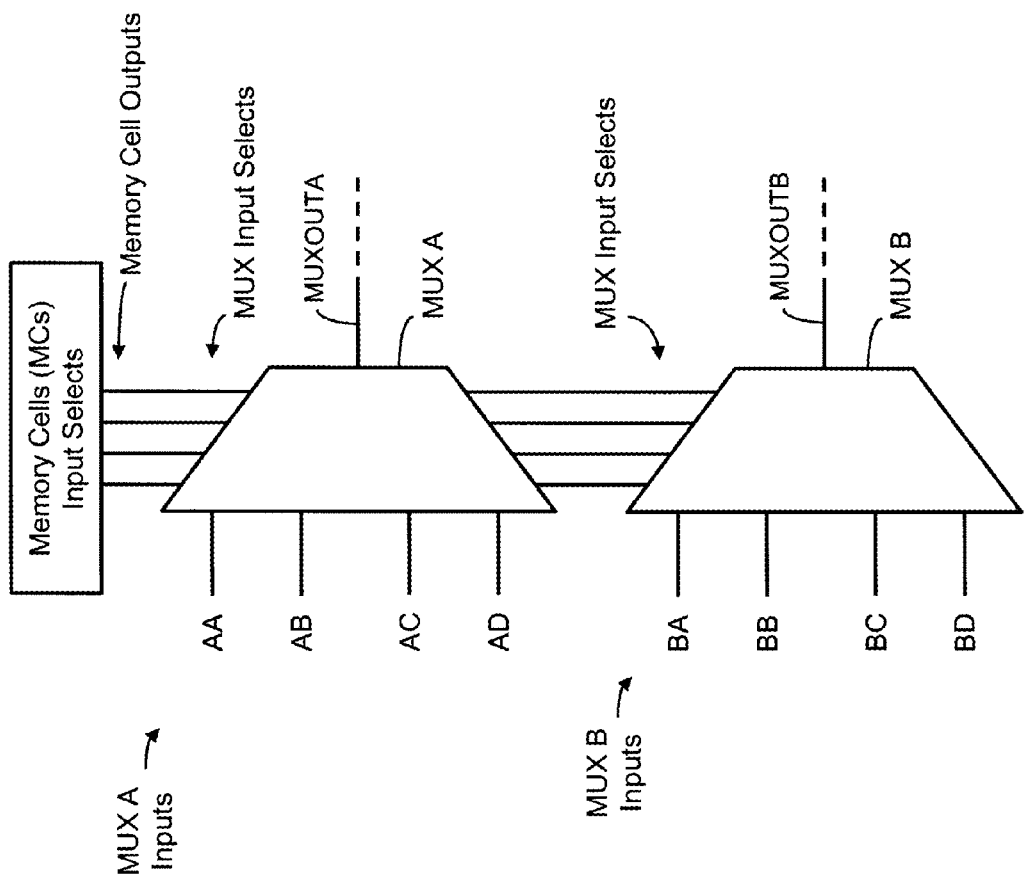
FIG. 2C illustrates an exemplary schematic block diagram representation of two 4-input multiplexers wherein common signals applied to the selection or control inputs of each multiplexers (i.e., Inputs AA, AB, AC, AD for MUX A and Inputs BA, BB, BC, BD for MUX B) to propagate selected inputs of MUX A to MUXOUT A and MUX B of MUXOUT B and, in this illustrative embodiment, each selection or control input may be connected to associated memory cell that store a data state which determines the active input of the multiplexer (i.e., which input of the multiplexer is connected to the multiplexer output); notably, although not illustrated in FIG. 2C, the memory cells may be six-transistor SRAM cells like the SRAM cell illustrated in Inset A of FIGS. 2A and 2B; the memory cell, however, may be a latch, flip/flop (e.g., a JK-type flip/flop) or any other memory cell or memory cell circuit now known or later developed; moreover, the multiplexers of FIG. 2C may have a circuit configuration like those illustrated in FIGS. 2A and 2B wherein each input is applied to a plurality of transmission gates and, as such, both the true-and-complement outputs (OUT and OUTb) of each memory cell are routed to respective gate of the NMOS and PMOS transistors of the transmission gates of each input to output propagation path.

With reference to FIGS. 2A-2C and 5B, in one embodiment of the present inventions, a plurality of N-input multiplexers, N-memory cell (for example, two N-input multiplexers where N=4 as illustrated in FIG. 2C), receive the same selection or control input signals via signals lines that are routed from the memory cells to each of the multiplexers MUX A and MUX B. In this embodiment, one, some or all of the selection or control input is/are routed from the memory cells (that store a state which determines the active input of the multiplexer), via a poly-silicon layer, to the associated transistors in multiplexers MUX A and MUX B. The outputs of the memory cells, which are disposed or formed in a silicon layer, are extended and routed beneath or underneath the VSS rail/conductor (see "Ex1") to associated transistors of multiplexer MUX A and beneath or underneath the VDD rail/conductor (see "Ex2") to associated transistors of multiplexer MUX B. For the sake of clarity, the transistors of multiplexer MUX B are not specifically illustrated—albeit, the transistor layout of MUX B is identical to the layout of MUX A mirrored along the X2-axis; the practice can be further extended (for example, to MUX C, not shown) to the extent that design rule constraints for manufacturing are not violated.

Thus, in this embodiment, conductor extensions ("Ex1" and/or "Ex2") are employed to connect the outputs of the memory cells to associated selection-inputs of static multiplexers (i.e., MUX A and MUX B) which receive common selection or control input signals. The static signals are routed in a layer of the integrated circuit (in this embodiment, the poly-silicon layer) directly from the memory cell outputs to the transistors (without traversing one or more different layers (for example, one or more different metal layers—e.g., metal layer M2). Although the layout is different from common design practices in standard-cell-based design, the outputs of the memory cells are routed to associated transistors of the static multiplexers via extending the poly-silicon route in order to provide a more compact and less complicated routing/layout relative to routing through a plurality of different layers.

In another aspect of the present inventions, a metal rail/conductor (for example, power (VDD) or ground (VSS)) is partitioned to permit word lines to be routed in a layer of the integrated circuit that reduces the number of vias employed in routing to the memory cells thereby providing a more compact and spatially efficient layout/footprint. For example, with reference to FIGS. 6 and 7, in one embodiment, the metal rail/conductor is partitioned to facilitate routing the word lines associated with the memory cells to contact the programming transistors of the memory cells. In addition, such an embodiment allows the word line to be shared with an adjacent N-input multiplexer, N-memory cell configuration (see, see Set A and Set B in FIG. 7).

Figure 6:
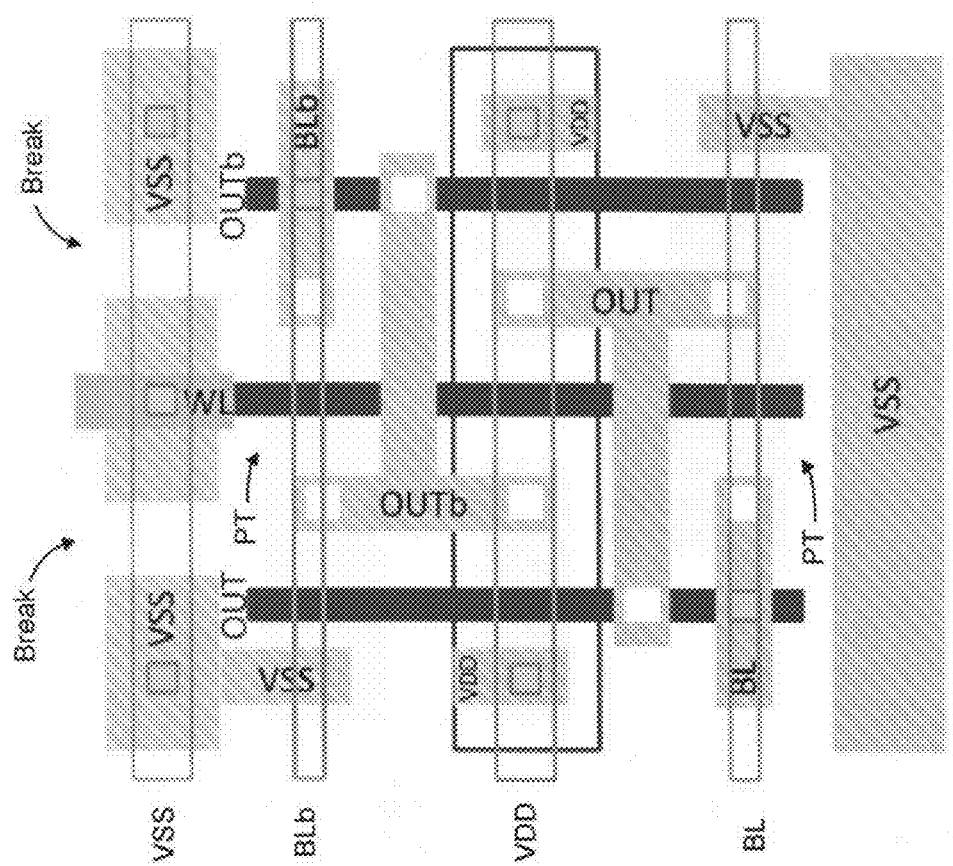
FIG. 6 illustrates a portion of an exemplary layout of the memory cell according to certain aspects of the present inventions wherein the word line (WL) connected to each programming transistor ("Programming Transistor" or "PT") of the memory cell is routed to metal layer M2 by breaking the top VSS rail/conductor, in contravention of design rules, to create or provide space (indicated as "Break") in/on the metal layer M1 in the middle to via down to the WL poly-silicon, and via up to M2 for routing; here, the top VSS rail/conductor extends horizontally on the metal layer M3, and via down to metal layer M1 when VSS is needed in the metal layer M1.

With continued reference to FIG. 6, in one embodiment, the word line (WL) connected to each programming transistor ("Programming Transistor" or "PT") of the memory cell is routed to metal layer M2 by breaking the VSS rail/conductor, in contravention of design rules, to create or provide space on the metal layer M1 in the middle to via down to the WL poly-silicon, and via up to M2 for routing. Notably, the VSS rail/conductor extends horizontally on the metal layer M3, and via down to metal layer M1 when VSS is employed in the metal layer M1.

With reference to FIG. 7, the embodiment of partitioning embodiment implemented in FIG. 6 may facilitate a more compact footprint/layout by arranging a first N-input multiplexer, N-memory cell circuit adjacent to a second an adjacent N-input multiplexer, N-memory cell circuit (see, see Set A and Set B). Here, the rows of memory cells are mirrored along the X-axis and share WL signals as well as reduce the number of vias in the routing using the inventive layout configuration of FIG. 6. Notably, it may also be advantageous to route the output signals of the memory cells may also be routed to the associated transistors of the multiplexer via the common layer (here, poly-silicon) by extending the poly-silicon routing underneath the VSS rail/conductor. That is, with reference to FIG. 7, the output signals OUT and OUTb of the memory cells may also be routed to the associated transistors of the multiplexer via the poly-silicon layer by extending the poly-silicon routing underneath VSS using the inventive layout techniques and configuration illustrated in FIG. 5A.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, although the outputs of the memory cells to the input selection control of the multiplexer are illustrated as being routed in a poly-silicon layer of the integrated circuit, the layer employed to directly route the memory cells to the multiplexer may be another layer of the integrated circuit.

In addition, although the selection circuitry of the multiplexer in the exemplary illustrations is described and illustrated herein as transmission gates, each transmission gate including two transistors (NMOS and PMOS transistors), selection circuitry may be any configuration now known or later developed. For example, the selection circuitry may include transmission gates—each consisting of one transistor (NMOS or PMOS transistor) that may be controlled (via a data state stored in an associated memory cell like that described herein) to form or provide an input to output propagation path for each of the inputs of the multiplexer. For the sake of brevity, the discussions above (for example, the layout and routing discussions) will not be repeated where the transmission gate consists of one transistor. Notably, in this exemplary embodiment, the memory cell may provide an output that is routed to an associated one transistor transmission gate in the same manner as described and illustrated herein in connection with the two transistor transmission gate.

Further, although the memory cells are illustrated as a static memory cells, the present inventions may employ dynamic or static memory cells (albeit, it may be advantageous (based on, for example, power consumption) to employ static-type cells). Indeed, as stated above, such static cells may be latches, flip/flops or any other static memory cell or memory cell circuit now known or later developed.

In addition, although aspects of the inventive embodiments have been described and illustrated in the context of extending beneath a ground (VSS) rail/conductor or partitioning or breaking a VSS rail/conductor, the present inventions may be employed in the context of extending beneath a power (VDD) rail/conductor or partitioning or breaking a VDD rail/conductor. Indeed, that conductor may carry any signal or voltage. For the sake of brevity, the discussions and illustrations will not be repeated specifically in the context of a power (VDD) rail/conductor or conductor carrying another signal or voltage—but such discussions and illustrations herein is to be interpreted as being entirely applicable to such implementations.

The substrate in the exemplary embodiments is silicon and, as such, in one embodiment, the extensions are poly-silicon extensions. That is, although the inventive layout is in contravention of typical standard-cell-based design practices, the conductors connecting the outputs of the memory cells to associated transistors of the static multiplexers include poly-silicon extension in lieu of multilayer routing using vias to connect the conductors disposed in/on the different layers of the integrated circuit. Where the base material is other than silicon, the routing via such extensions may be other than doped silicon.

Moreover, the polarity of the data state stored in a memory cell may be selected, adjusted and/or changed to accommodate the routing inventions described and/or illustrated herein. For example, where there is an offset of the poly-silicon routing between an output of the static memory cell and an associated transistor in the multiplexer, the data state stored in the memory cell may be selected, modified and/or changed in order to implement the routing techniques of the present inventions. In one exemplary embodiment, the stated/polarity of the data stored in the memory cell is selected and/or changed (relative to a normal or typical layout) to accommodate routing the output and output/b to the respective gate of the PMOS and NMOS transistors, respectively, of the transmission gates of an input to output propagation path of the multiplexer. As such, a data state stored in memory would typically be "high" (under the circumstances of no offset in routing of the select/control signals) would be changed to "low" (in view of the offset in routing of the select/control signals) so that the output and output/b of the memory cell which are applied to the respective gate of the PMOS and NMOS transistors (thereby selecting the active input by enabling the transistors) to select an active input of the multiplexer.

Notably, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

The layout techniques described herein may be implemented using one or more processors (suitably programmed) to perform, execute and/or assess one or more of the functions or operations described herein to program memory cells and generate distribution and transmission networks or architectures of the present inventions.

Notably, various circuits, circuitry, layout and routing disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process. As such, the circuits, circuitry, layouts and routing disclosed herein may be represented as one or more masks employed during the fabrication process to create or form the transistors, circuits, circuitry, routing and memory cells described and/or illustrated herein in/on an integrated circuit (for example, a processor, controller, state machine, gate array, SOC, PGA and/or an FPGA, such in one or more logic tiles of an FPGA).

Moreover, the various circuits, circuitry, layout and routing, as well as techniques, disclosed herein may be represented via simulations using computer aided design and/or testing tools. The simulation of the inventive circuits, circuitry, layout and routing, and/or techniques implemented thereby, may be implemented by a computer system wherein characteristics and operations of such circuits, circuitry, layout and routing, and techniques implemented thereby, are imitated, replicated and/or predicted via a computer system. The present inventions are also directed to such simulations of the inventive circuits, circuitry, layout and routing, and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative and not restrictive.

As used in the claims, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus.

In the claims, and elsewhere, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "data" may mean, among other things, a current or voltage signal(s) whether in analog or a digital form (which may be a single bit (or the like) or multiple bits (or the like)). Further, the term "logic tile" means a design unit or block of a plurality of transistors (typically thousands to millions), which, in this application, is capable of connecting or connected to a plurality of neighboring "tile", "core" or "block" (for example, in or during operation).

What is claimed is:

1. An integrated circuit disposed in and on a substrate, the integrated circuit comprising:
   a plurality of logic tiles, wherein each logic tile includes a plurality of edges and, is configurable to communicate, during operation, with at least one logic tile that is adjacent to an edge, and wherein a first logic tile of the plurality of logic tiles includes:
      a plurality of memory cells to store data, wherein each memory cell includes a first output;
      a multiplexer including a plurality of inputs, an output and a plurality of input selects;
      a first plurality of poly-silicon conductors, each poly-silicon conductor is disposed in the substrate and connected to the first output of an associated memory cell; and
      a first plurality of poly-silicon extensions, each poly-silicon extension is (i) connected to an associated poly-silicon conductor of the first plurality of poly-silicon conductors and (ii) coupled to an associated input select of the multiplexer, wherein the first plurality of poly-silicon extensions are disposed in the substrate and at least partially under a metal conductor in the first logic tile.

2. The integrated circuit of claim 1 wherein:
   each memory cell includes a second output,
   each input select of the multiplexer includes a complementary input pair and each poly-silicon extension of the first plurality is coupled to a unique input of the complementary input pairs of the associated input select of the multiplexer, and
   the first logic tile further includes:
      a second plurality of poly-silicon conductors, each poly-silicon conductor of the second plurality is disposed in the substrate and connected to the second output of an associated memory cell, and
      a second plurality of poly-silicon extensions, each poly-silicon extension of the second plurality is (i) connected to an associated poly-silicon conductor of the second plurality of poly-silicon conductors and (ii) coupled to a unique input of the complementary input pairs of an associated input select of the multiplexer, wherein the second plurality of poly-silicon extensions are disposed in the substrate and at least partially under the metal conductor in the first logic tile.

3. The integrated circuit of claim 2 wherein:
   the multiplexer further includes a plurality of transmission gates, wherein each transmission gate is associated with an input and a complementary input pair of an input select of the multiplexer, and
   each poly-silicon extension is coupled to the transmission gate of the associated input select of the multiplexer.

4. The integrated circuit of claim 3 wherein each transmission gate includes a plurality of transistors wherein the gate of transistor is coupled to the unique poly-silicon extension of the first or second pluralities of poly-silicon extensions.

5. The integrated circuit of claim 1 wherein:
   the multiplexer further includes a plurality of transmission gates, wherein each transmission gate is associated with an input and an input select of the multiplexer, and
   each poly-silicon extension is coupled to the transmission gate of the associated input select of the multiplexer.

6. The integrated circuit of claim 5 wherein each transmission gate includes at least one transistor wherein the gate thereof is coupled to the unique poly-silicon extension associated with the input select which is associated that is associated with the transmission gate.

7. The integrated circuit of claim 1 wherein each memory cell of the plurality of memory cells is a static memory cell.

8. The integrated circuit of claim 1 wherein the first logic tile of the plurality of logic tiles further includes a second plurality of poly-silicon conductors, each poly-silicon conductor of the second plurality include is disposed in the substrate and between and connected to an associated poly-silicon extension of the first plurality and an associated input select of the multiplexer wherein a first end of the poly-silicon conductor of the second plurality is connected to the associated poly-silicon extension of the first plurality.

9. An integrated circuit disposed in and on a substrate, the integrated circuit comprising:
   a plurality of logic tiles, wherein each logic tile includes a plurality of edges and, is configurable to communicate, during operation, with at least one logic tile that is adjacent to an edge, and wherein a first logic tile of the plurality of logic tiles includes:
      a plurality of memory cells to store data, wherein each memory cell includes a first output;
      a first multiplexer including a plurality of inputs, an output and a plurality of input selects;
      a first plurality of poly-silicon conductors, each poly-silicon conductor of the first plurality is disposed in the substrate and connected to the first output of an associated memory cell;
      a first plurality of poly-silicon extensions, each poly-silicon extension having a first end and a second end, wherein each poly-silicon extension of the first plurality is (i) connected at a first end to an associated poly-silicon conductor of the first plurality of poly-silicon conductors and (ii) coupled at a second end to an associated input select of the first multiplexer, wherein the first plurality of poly-silicon extensions are disposed in the substrate and at least partially under a first metal conductor in the first logic tile;

a second multiplexer including a plurality of inputs, an output and a plurality of input selects; and a second plurality of poly-silicon extensions, each poly-silicon extension of the second plurality having a first end and a second end, wherein each poly-silicon extension of the second plurality is (i) coupled at a first end to a second end of a unique poly-silicon extension of the first plurality of poly-silicon extensions and (ii) coupled at a second end to an associated input select of the second multiplexer, wherein the second plurality of poly-silicon extensions are disposed in the substrate and at least partially under a second metal conductor in the first logic tile.

10. The integrated circuit of claim 9 wherein the first logic tile of the plurality of logic tiles further includes a second plurality of poly-silicon conductors, each poly-silicon conductor is disposed in the substrate and between and connected to a second end of an associated poly-silicon extension of the first plurality and a first end of an associated poly-silicon extension of the second plurality.

11. The integrated circuit of claim 9 wherein:
each memory cell includes a second output,
each input select of the first and second multiplexers includes a complementary input pair and each poly-silicon extension of the first and second pluralities of poly-silicon extension is coupled to an input of the complementary input pair of the associated input select of the multiplexer, and
the first logic tile further includes:
a second plurality of poly-silicon conductors, each poly-silicon conductor of the second plurality is disposed in the substrate and connected to the second output of an associated memory cell,
a third plurality of poly-silicon extensions, each poly-silicon extension of the third plurality is (i) connected to an associated poly-silicon conductor of the second plurality of poly-silicon conductors and (ii) coupled to a unique input of the complementary input pairs of an associated input select of the first multiplexer, wherein the third plurality of poly-silicon extensions are disposed in the substrate and at least partially under the first metal conductor in the first logic tile, and
a fourth plurality of poly-silicon extensions, each poly-silicon extension of the fourth plurality of poly-silicon extensions having a first end and a second end, wherein each poly-silicon conductor of the fourth plurality is (i) coupled at a first end to a second end of a unique poly-silicon extension of the third plurality of poly-silicon extensions and (ii) coupled at a second end to an associated input select of the second multiplexer, wherein the fourth plurality of poly-silicon extensions are disposed in the substrate and at least partially under the second metal conductor in the first logic tile.

12. The integrated circuit of claim 9 wherein:
the first and second multiplexers further include a plurality of transmission gates, wherein each transmission gate is associated with an input and a complementary input pair of an input select of the multiplexer, and each poly-silicon extension of the first, second, third and fourth pluralities of poly-silicon extensions is coupled, at a second end thereof, to the transmission gate of the associated input select.

13. The integrated circuit of claim 12 wherein each transmission gate includes a plurality of transistors.

14. The integrated circuit of claim 9 wherein:
the first and second multiplexers further include a plurality of transmission gates, wherein each transmission gate is associated with an input and an input select of the first or second multiplexer, and
the transmission gate of the associated input select of the multiplexer is coupled to a unique poly-silicon extension of the first, second, third or fourth pluralities of poly-silicon extensions.

15. The integrated circuit of claim 14 wherein each transmission gate includes at least one transistor wherein the gate thereof is coupled to a second end of a unique poly-silicon extension of the first, second, third or fourth pluralities of poly-silicon extensions.

16. The integrated circuit of claim 9 wherein each memory cell of the plurality of memory cells is a static memory cell.

17. An integrated circuit disposed in and on a substrate, the integrated circuit comprising:
a plurality of logic tiles, wherein each logic tile includes a plurality of edges and, is configurable to communicate, during operation, with at least one logic tile that is adjacent to an edge, and wherein a first logic tile of the plurality of logic tiles includes:
a plurality of static memory cells to store data, wherein each memory cell includes a first output;
a multiplexer including a plurality of inputs, an output and a plurality of input selects;
a first plurality of poly-silicon conductors, each poly-silicon conductor is disposed in the substrate and connected to the first output of an associated memory cell;
poly-silicon extensions, each poly-silicon extension is (i) connected to an associated poly-silicon conductor of the first plurality of poly-silicon conductors and (ii) coupled to an associated input select of the multiplexer, wherein the poly-silicon extensions are disposed in the substrate and at least partially under a metal conductor in the first logic tile; and
a second plurality of poly-silicon conductors, each poly-silicon conductor of the second plurality includes first and second ends and is disposed in the substrate, wherein the first end is connected to the associated poly-silicon extension and the second end is connected at the associated input select of the multiplexer.

18. The integrated circuit of claim 17 wherein:
the multiplexer further includes a plurality of transmission gates, wherein each transmission gate is associated with an input and an input select of the multiplexer, and
each poly-silicon conductor of the second plurality is connected to the transmission gate of the associated input select of the multiplexer.

19. The integrated circuit of claim 18 wherein each transmission gate includes a plurality of transistors wherein each gate thereof is connected to a unique poly-silicon conductor of the second plurality of poly-silicon conductors.

20. The integrated circuit of claim 18 wherein each transmission gate includes at least one transistor wherein the gate thereof is connected to a unique poly-silicon conductor of the second plurality of poly-silicon conductors.

\* \* \* \* \*